United States Patent [19]
Chan

[11] Patent Number: 6,005,296
[45] Date of Patent: Dec. 21, 1999

[54] LAYOUT FOR SRAM STRUCTURE

[75] Inventor: Tsiu Chiu Chan, Carrollton, Tex.

[73] Assignee: STMicroelectronics, Inc., Carrollton, Tex.

[21] Appl. No.: 08/865,641

[22] Filed: May 30, 1997

[51] Int. Cl.⁶ .................................................. H01L 27/11
[52] U.S. Cl. ........................................ 257/904; 257/903
[58] Field of Search ..................................... 257/903, 904

[56] References Cited

U.S. PATENT DOCUMENTS

| | | | |
|---|---|---|---|
| 4,125,854 | 11/1978 | McKenny et al. | 257/379 |
| 4,251,876 | 2/1981 | McKenny et al. | 365/182 |
| 4,868,138 | 9/1989 | Chan et al. | 438/297 |
| 5,072,286 | 12/1991 | Minami et al. | 257/208 |
| 5,124,774 | 6/1992 | Godinho et al. | 257/904 |
| 5,298,782 | 3/1994 | Sundaresan | 257/393 |
| 5,330,933 | 7/1994 | Chan et al. | 438/384 |
| 5,745,404 | 4/1998 | Lien et al. | 365/154 |
| 5,841,153 | 11/1998 | Kuriyama et al. | 257/69 |

FOREIGN PATENT DOCUMENTS

| | | |
|---|---|---|
| 0 087 979 A2 | 9/1983 | European Pat. Off. . |
| 0 514 094 A2 | 11/1992 | European Pat. Off. . |

*Primary Examiner*—Mahshid Saadat
*Assistant Examiner*—George C. Eckert, II
*Attorney, Agent, or Firm*—David V. Carlson; Theodore E. Galanthay; Lisa K. Jorgenson

[57] ABSTRACT

A layout is provided for an SRAM structure. The layout includes a first storage transistor cross-coupled to a second storage transistor to form an SRAM cell. The source regions of the first and second storage transistors are formed in a common region in the substrate to provide a more compact and dense array. The memory cell also includes a first access transistor and a second access transistor appropriately coupled to the appropriate data storage notes. The gate electrodes for the storage transistors and the access transistors are substantially parallel to each other thus providing advantages in operational characteristics and layout efficiencies. The channel regions are also exactly perpendicular to the gate electrodes and are parallel to each other for each of their respective transistors, thereby obtaining similar benefits. The memory cell is designed having a low aspect ratio, preferably lower than 1.2. A single metal line has two contacts to the common source region to ensure grounding of the memory cell at all times and the removal of any stray and parasitic currents which may occur from time to time. The same metal source line is also connected to the P well to ensure that the source region and P well are held at the same voltage at all times and to prevent P well bounce.

23 Claims, 10 Drawing Sheets

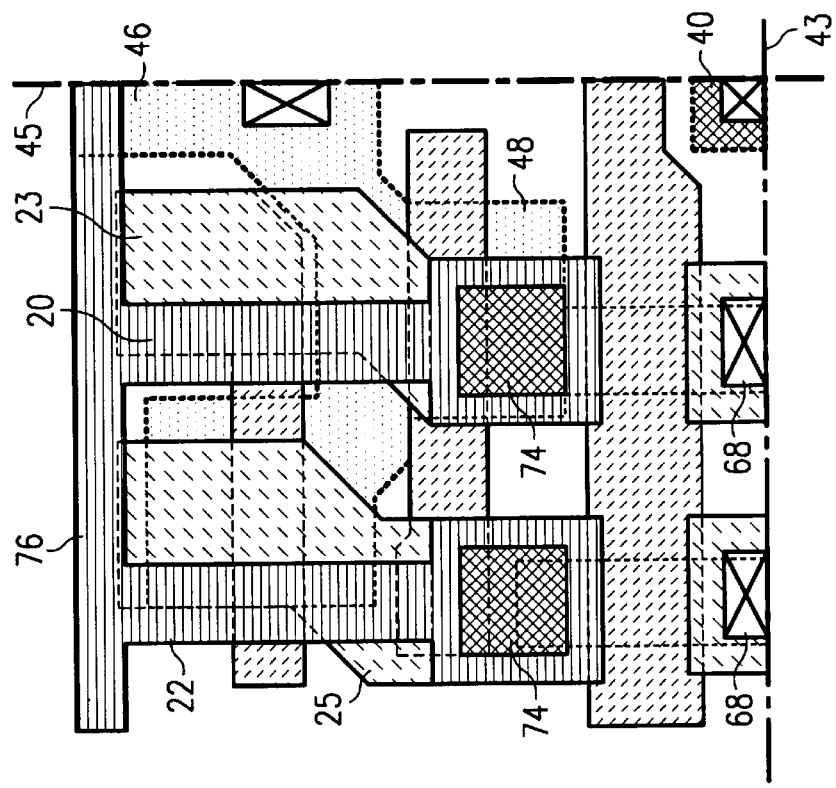
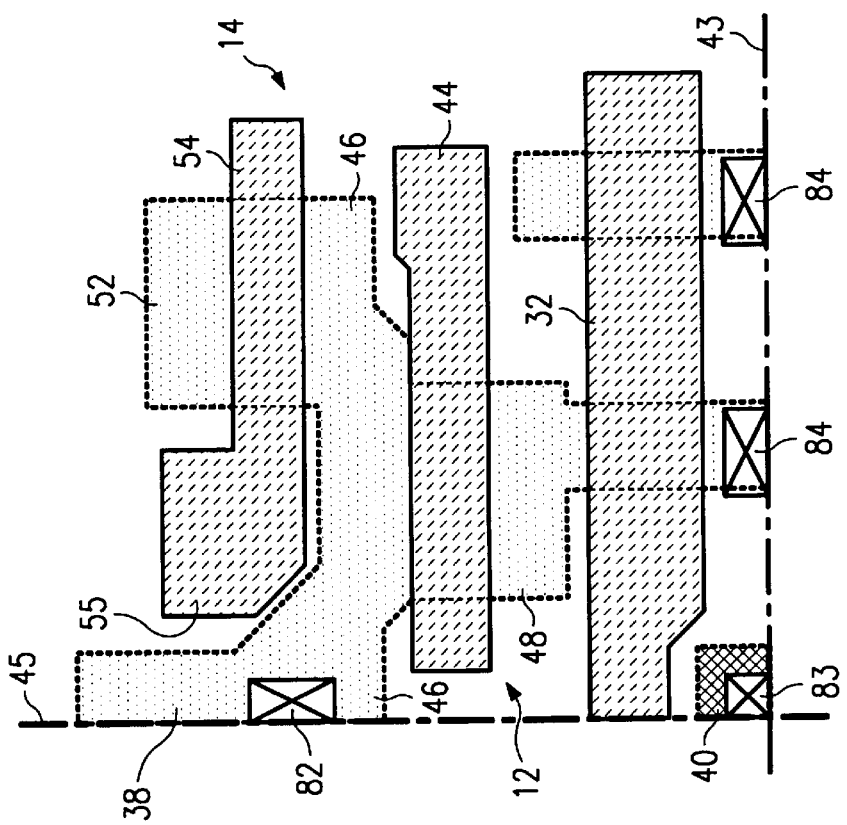

LAYOUT FOR SRAM STRUCTURE

TECHNICAL FIELD

This invention relates to the layout of an SRAM structure and, more particularly, to the layout of an array of SRAM memory cells.

BACKGROUND OF THE INVENTION

Static Random Access Memories (SRAM) are widely used in computer systems and other applications to store data. U.S. Pat. No. 4,125,854 (the '854 patent) to Vern McKinney and T. C. Chan and U.S. Pat. No. 5,298,782 to Sundaresan disclose a layout for an SRAM memory cell, both of which are incorporated herein by reference.

Two of the features that are relevant in the design of the memory cell are the total area occupied by the memory cell and the aspect ratio. It is desirable to make the silicon area occupied by the memory cell as small as practical so as to increase the density of the memory array. A memory cell that occupies a small area of silicon permits more memory cells to be fabricated on a single silicon chip of a given size.

The aspect ratio is a measure of the squareness of the memory cell. The height of the memory cell is divided by the width to produce a numerical value of the aspect ratio. The height is measured along the bit line, the width along the word line. For example, if the height of the memory cell is 11 microns and the width is 6 microns, this produces a memory cell having an aspect ratio of approximately 1.83 and an area of 66 square microns. On the other hand, a memory cell which is 9 microns in height and 7.5 microns in width has an aspect ratio of 1.2 and occupies just slightly more area, 67.5 microns. A perfectly square memory cell would have an aspect ratio of 1.0.

A square area for the entire memory array and for the entire chip, including the peripheral circuits, is often preferred. Use of a memory which has a low aspect ratio, in the range of 1.1 or 1.2 is advantageous in those designs where a square die is desirable for the entire memory array. It is therefore helpful to provide a memory cell which has not only a low area but also a low aspect ratio.

FIG. 1 shows the layout of a memory cell according to the prior art. As can be seen by viewing this layout, it is generally rectangular in shape, rather than generally square. It has an aspect ratio of approximately 1.63 as can be determined by dividing its height by its width. Accordingly, if this memory cell is repeated throughout the chip, the array of memory cells will be more rectangular than square. The design of FIG. 1 therefore makes it more difficult to obtain a square final chip which occupies a minimal silicon area.

The memory cell includes the first polysilicon layer 2 and a second polysilicon layer 3. A third polysilicon layer is also present, however, its layout and position is similar to that shown in FIG. 6 of the present invention and therefore is not repeated here. The first layer 2 of polysilicon includes the gate electrodes of the wordline 5 and the gate electrodes 7 of the storage transistors. The wordline 5 has a significant bend as shown at position 6 between the two bit lines of the memory cell. The bitline is therefore, not straight through the memory cell and instead undergoes a significant change of direction. If a straight line 8 is drawn through any portion along the length of wordline 5, the change of direction of the wordline is sufficiently great that it completely deviates from the straight line 8, which is a greater distance than its own width.

In addition, the gates of the storage transistors 7, are perpendicular to the direction of the gate electrodes of the word line 5. The gate electrodes 7 are not straight and also undergo a bend. Further, the channel regions underlying the gate electrodes 7 of the storage transistors do not run in the same direction and are not parallel to the channel regions underneath the word line gate electrode 5, as can be seen viewing FIG. 1.

SUMMARY OF THE INVENTION

According to principles of the present invention, a memory cell for an SRAM is provided which has a low aspect ratio. The SRAM memory cell is composed of four transistors, two storage transistors and two access transistors. All four gates of the transistors are oriented in the same direction. Further, the transistor gates are straight. The channel regions of the four transistors are in an orthogonal direction to the direction of the gates. This combination provides the advantage that the cell has improved operational characteristics and can be much smaller for a given minimum geometry. The smaller size can be achieved because misalignments and directional process variations have less effects on cell stabilities.

The two storage transistors have a common source region in the substrate. In a preferred embodiment, that same common source region is shared by four adjacent memory cells with the two storage transistors of each memory cell sharing the common source region. A single metal line connected to ground makes two contacts to this common source region in one embodiment. The use of two contacts provides a lower resistance path to ground and reduces the distance from the memory cell to respective ground location so the stray currents may more easily be grounded. It also provides a backup contact so that in the event one of the paths has a slightly higher resistance than preferred, the other path will still provide solid contact to ground. The same metal line is also connected to the substrate to ensure that the source of the transistors in the substrate is always held at the same ground voltage and to prevent well bounce.

According to a process for forming the circuit of the present invention, contact openings are made to poly 1 at selected locations prior to the etching of poly 1 to form the gate electrodes. After this, a number of process steps are carried out which include oxide depositions, an LDD implant, oxide deposition to form the sidewall spacers, etching to form the sidewall spacers, and other process steps. Following these process steps, a single mask is used to form contact openings to the diffusion and to poly 1. Poly 2 is then deposited and contacts poly 1 at some locations and diffusion at other locations through the use of a single contact mask. The use of a single mask for forming both the contact to poly 1 and the contacts to the diffusion permit self-alignment of the poly 2 contact for more close spacing.

BRIEF DESCRIPTION OF THE DRAWINGS

FIG. 10 is a plan view of the layout of a single memory cell according to an alternative embodiment showing poly 1 and active area.

FIG. 11 is a plan view of the layout of the memory cell of FIG. 10 showing active area, poly 1, poly 2, poly 3, contact openings from poly 3 to poly 2 and from metal 1 to poly 2 and substrate.

DETAILED DESCRIPTION OF THE INVENTION

Figure 1:
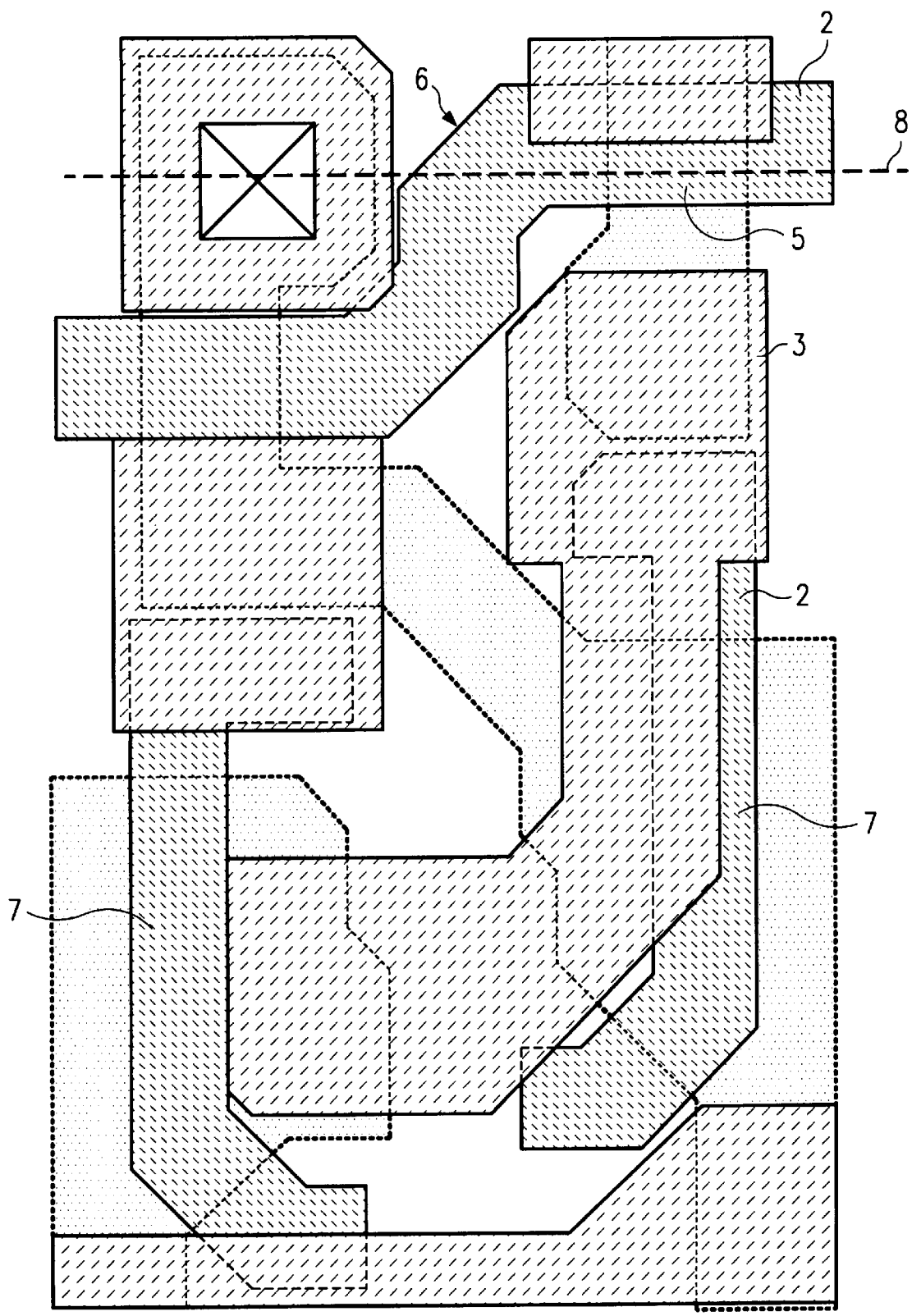
FIG. 1 is a plan view of the layout of a single memory cell according to the prior art.
Figure 2:
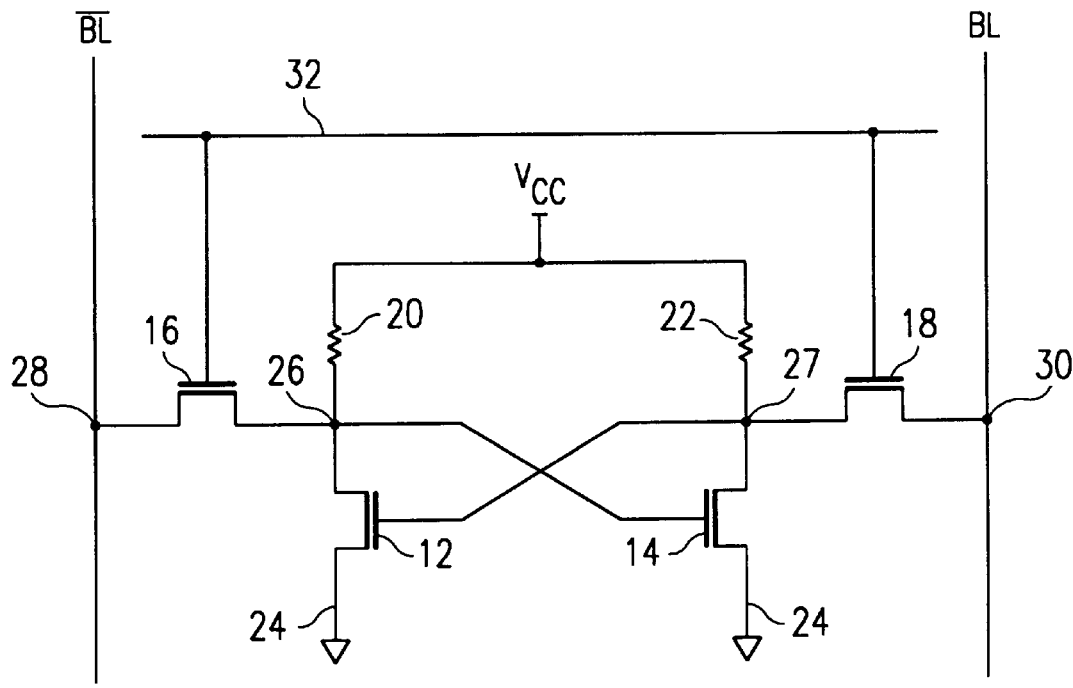
FIG. 2 is an electrical schematic of the memory cell of FIG. 1, drawn in a manner which is known in the prior art.

FIG. 2 shows an electrical schematic of an SRAM memory cell drawn in a conventional fashion. The electrical circuit of an SRAM memory cell of this type is well-known in the art. See, for example, the '854, which shows a similar electrical schematic. The layout in silicon of a memory cell to obtain this electrical schematic, on the other hand, is very different from the prior art. The present invention is directed toward the layout of the memory cell and process to achieve the electrical schematic shown in FIG. 2.

Figure 3:
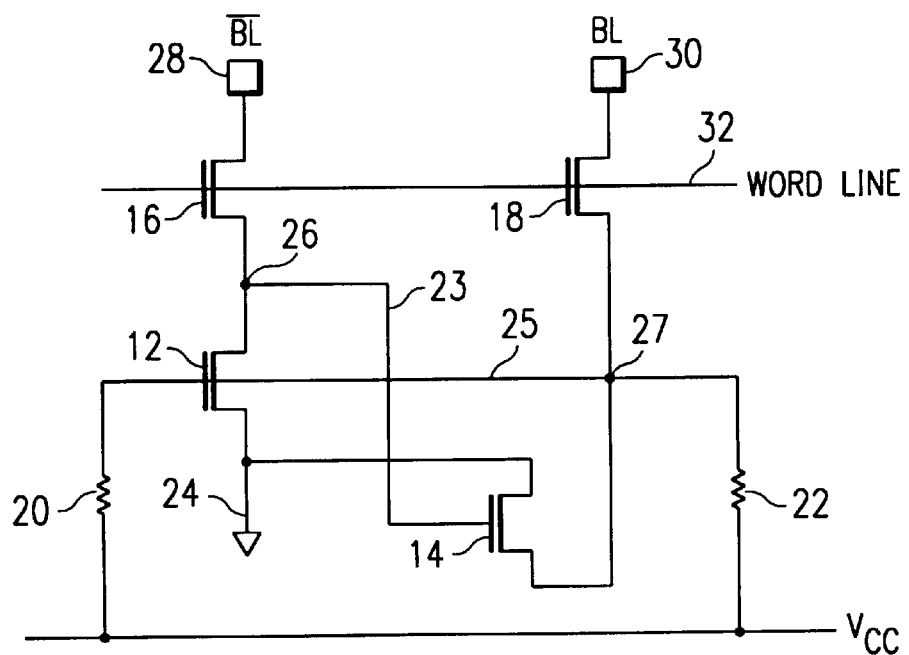
FIG. 3 is an electrical schematic drawn to resemble the layout of a memory cell according to the present invention.

FIG. 3 shows the electrical schematic of a memory cell drawn to somewhat resemble the layout. The electrical connections and resulting electrical circuit are the same as that of FIG. 2; but the operation of the circuit and efficiency of the connection is improved considerably by the new layout of the present invention.

The SRAM circuit shown in FIGS. 2 and 3 includes a first storage transistor 12 and a second storage transistor 14. It also includes a first access transistor 16, a second access transistor 18, a first load element 20, and a second load element 22. The sources of the two storage transistors 12 and 14 are tied to a common ground supply 24. The two load elements have one end tied to a positive voltage supply $V_{CC}$ and the other end connected to a respective data node. The gate of each storage transistor is coupled by conductive lines 23 and 25 to the respective drain of the other storage transistor to form a first data node 26 and a second data node 27.

The electrical schematic of FIG. 3 shows some features that are beneficial to understanding the present invention. The gate electrodes of access transistors 16 and 18 are parallel to the gate electrodes of the storage transistors 12 and 14. Further, word line 32 runs in a straight line from access transistor 16 to transistor 18 to provide their respective gate electrodes. The channel regions of all four transistors are parallel to each other. The sources of the two storage transistors 12 and 14 are tied together and to a common ground connection. The access transistors 16 and 18 also each have a drain/source region connected to the respective data nodes 26 and 27. The source/drain region of each of the respective access transistors 16 and 18 is connected at nodes 28 and 30 to bitline1 (B1), and bitline1 (B1). The access transistors 16 and 18 have their gates connected to a common wordline 32.

As will be appreciated, the access transistors each have a drain region and a source region. However, depending on the state of the memory cell and whether a read or write is being performed, as well as the state of the data being read or written, the identity of the source and drain regions of the access transistors may change so that one region which is the drain may, at some other time, be the source. As is well known, the source of a transistor is that region whose electrical potential is closest to the body voltage, for an n-channel transistor, this is ground. Accordingly, the access transistors are referred to as each having a drain, a source or a drain/source region and a source/drain region, respectively, as a recognition that the identity of the regions may change, even though at any one time a particular region is either a drain or a source. For these access transistors, the terms drain, source and drain/source can be used interchangeably.

The operation of the memory cell of FIGS. 2 and 3 is well known in the art and has been described in a number of patents, including the '854 patent, and therefore does not need to be discussed further.

FIGS. 4–7 show a layout of four memory cells according to principles of the present invention. The layers are shown in separate figures so that they may more easily be visualized and better understood. In the final product, all these layers are together on top of each other on the same semiconductor substrate to form the electrical circuit of FIG. 3.

Figure 4:
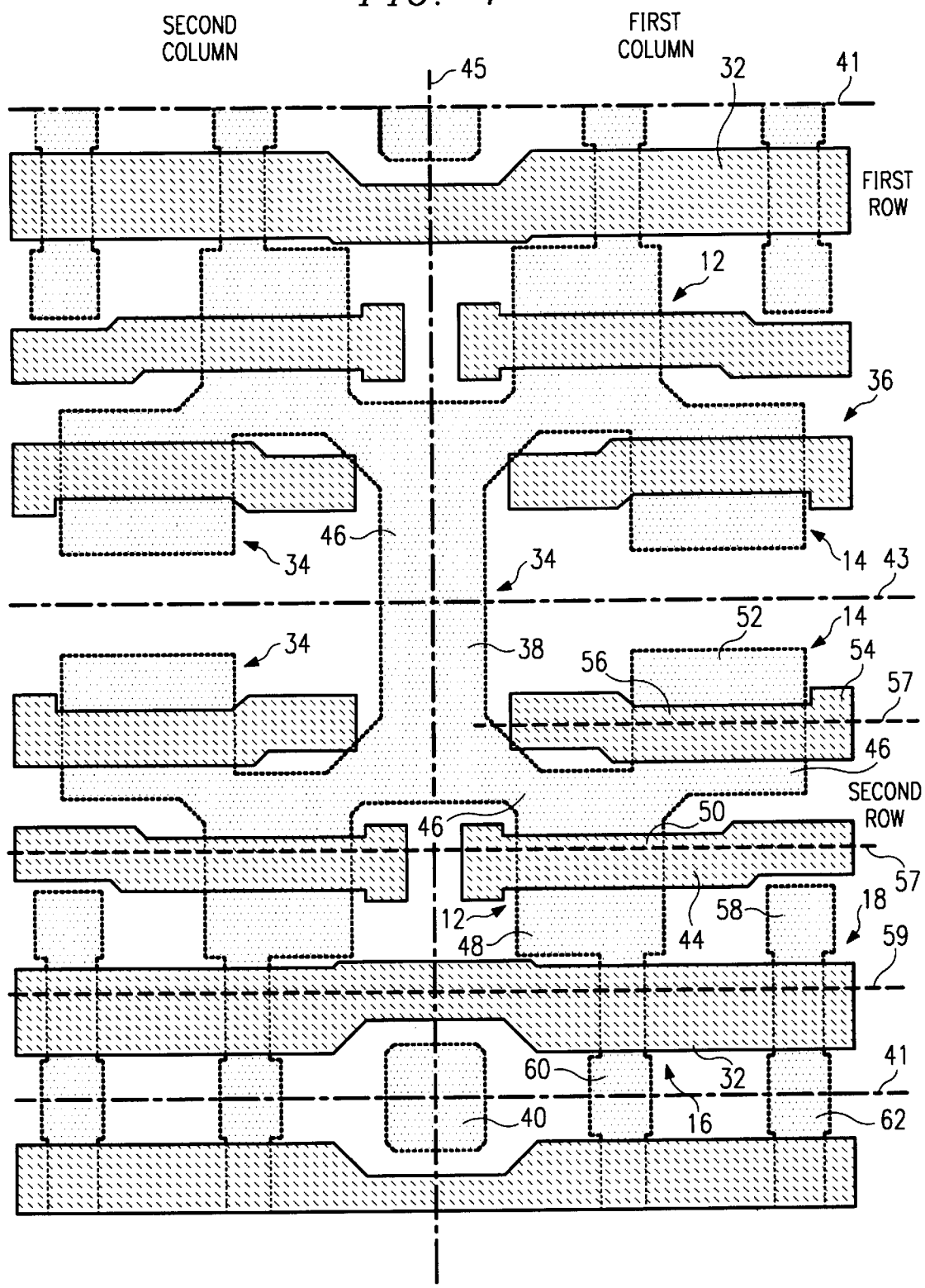
FIG. 4 is a plan view of the layout according to the invention of four memory cells showing the active area and poly 1.

FIG. 4 shows an active area 34 and a poly 1 layer 36. Within a transistor, the active area 34 includes the drains and sources and the channel under each gate electrode. The region 38 is doped N type to form a common source region of the various storage transistors. P+ doped region 40 forms a tie to the P well to provide a low resistance electrical contact from the substrate to ground.

The transistor components of a single memory cell will now be described and corresponding reference numbers from FIG. 3 will be used for ease of reference. A first storage transistor 12 is composed of a gate electrode 44, a source region 46 and a drain region 48. A channel region 50 extends under the gate electrode 44 between the source region 46 and the drain region 48. The second storage transistor 14 has a source region 46 and a drain region 52. The source region 46 is a common region in the substrate with the source region 46 of the first storage transistor 12. The second storage transistor 14 has a gate electrode 54 and a channel region 56 underneath the gate electrode 54 positioned between the source region 46 and the drain 52.

As can be seen by viewing FIG. 3, the source regions 46 of the two transistors 14 and 12 are electrically coupled together, and as shown in FIG. 4, also form a continuous common region 38 in the substrate. This region 38 in the substrate is a continuous common area with four memory cells positioned in adjacent columns and rows. The N+ active area 38 is mirror symmetrical about the horizontal center line 43 and vertical center line 45. This provides efficient use of substrate area and permits the memory cells to be more compactly arranged on the substrate. The source region 38 and the P well contact 40 are electrically tied together through a common metal line to ensure that they remain at the same ground voltage at all times, thus significantly reducing P well bounce and stray currents.

The wordline 32 is the gate electrode for the access transistors 16 and 18. Access transistor 16 has a drain/source region 48 and source/drain region 60. Similarly, access transistor 18 includes drain/source region 58 and source/drain regions 62. As will be appreciated, the region 48 can be either the drain or the source of access transistor 16 and therefore can be referred to as either or as the drain/source region of that transistor. This is also true for the drain/source regions of access transistor 18.

An array of memory cells are positioned on the memory chip and laid out in rows and columns. FIG. 4 shows two of the memory cells in a first column and a second column. It also shows a first row and a second row of the same four memory cells. The wordline 32 extends along a single row of many memory cells. The memory cell which is labeled with many reference numbers is in column 1, row 2, as can be seen in FIG. 4. It shares a common area of source region with three other memory cells that are not numbered for simplicity, namely the memory cell in row 2, column 2 and the two memory cells in row 1, columns 1 and 2.

The layout of four memory cells in each adjacent pair of rows and each adjacent pair of columns is repeated and is identical throughout the entire array. Namely, an identical set of four memory cells is immediately to the left and right of the ones shown. Similarly, the rows of memory cells are repeated having an identical layout to those shown here. The two rows on the top and bottom are replicated in mirror image fashion about horizontal axis 41. Namely, the third and fourth rows are a mirror image of the memory cells of the first and second rows around line 41 at the bottom of FIG. 4. Similarly, the two preceding rows prior to the first and second row are a mirror image about line 41 at the top of the memory cell as shown in FIG. 4. Furthermore, the four memory cells themselves are a mirror image of each other about horizontal centerline 43 and vertical centerline 45. Each set of four memory cells is symmetrical about source region 38 for each of the other memory cells within the group.

All the gate electrodes formed from poly 1 are generally parallel to each other and extend in substantially straight lines. The gate electrodes do not deviate from a straight line by a distance greater than their own widths in one embodiment. This can be seen because the gate electrodes are sufficiently straight that a single straight line 57 may be positioned which extends completely from one end of the gate electrode to the other end, without leaving the polysilicon. Thus, even though there may be slight enlargements or minor variations, the changes in direction are never greater than the width of the polysilicon itself. This is also true for word lines 32. A straight line 59 may be positioned through the gate electrodes that form the wordlines 32. In addition, the lines 57 and 59 are parallel to each other. While only one respective line 57 and 59 are shown for each electrode, it is to be understood that a nearly infinite number of such parallel lines can be drawn through each of the respective gate electrodes. In a preferred embodiment. the deviation from a straight line is less than half its own width, as can be seen that lines 57 and 59 could be positioned anywhere over half of the width of the gate electrodes. Having the gate electrodes of the storage transistors and of the wordlines straight and parallel to each other provides significant advantages in assuring that the cell is stable in operation and improves the reliability and electrical operation of the memory cells as a whole.

FIG. 4 is drawn to relative scale; this memory cell of the invention can thus be seen as having an aspect ratio of about 1.2. The height divided by the width is almost exactly 1.19, and thus just slightly under 1.2. This particular shape and aspect ratio is advantageous for many memory chips.

Figure 5:
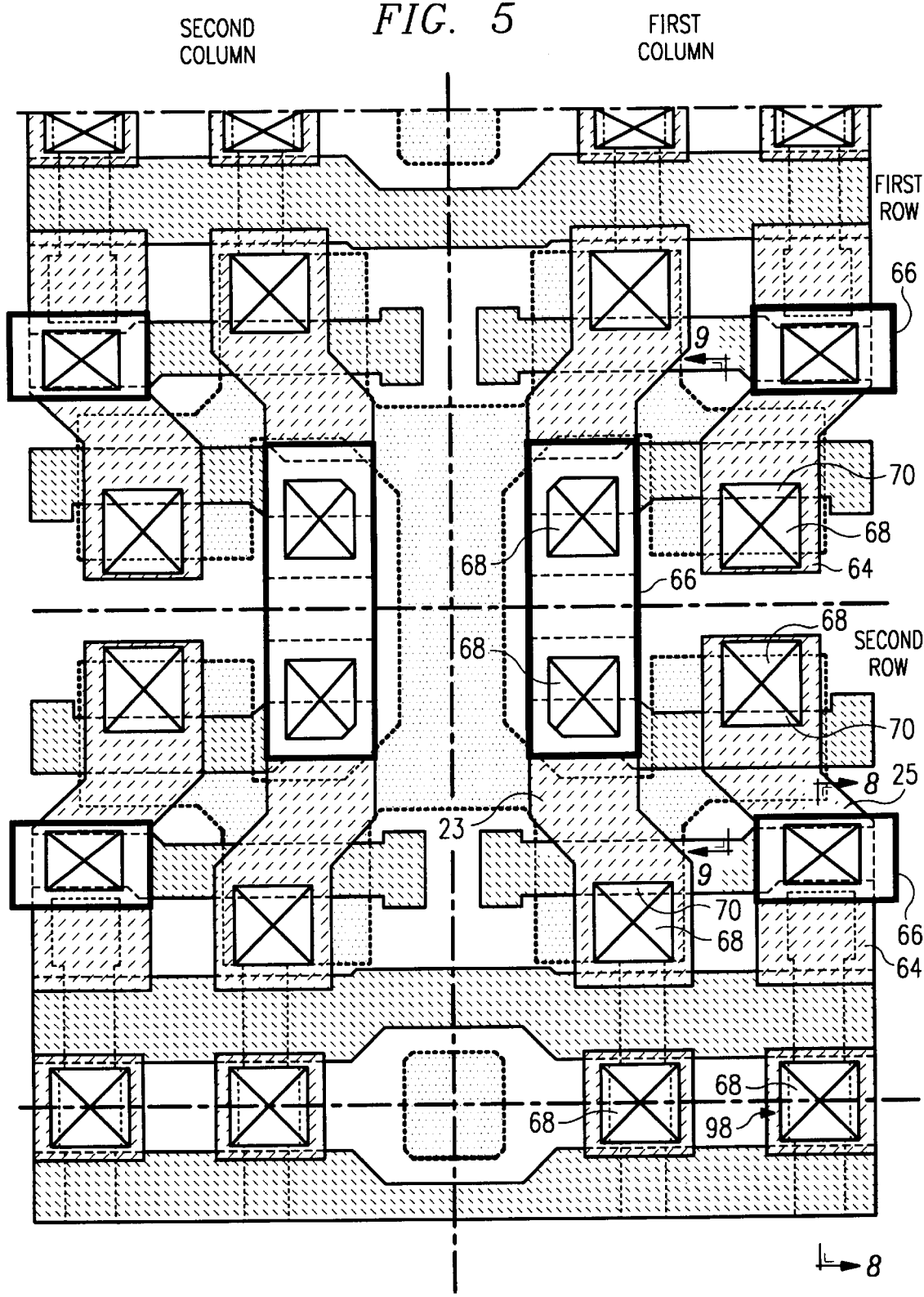
FIG. 5 is a plan view of the layout according to the invention of four memory cells showing the active area, poly 1, poly 2 to poly 1 contact openings, and poly 2 to substrate contact openings.

FIG. 5 shows the same layers as shown in FIG. 3 and in addition shows poly 2 and the contact openings from poly 2 to poly 1 and to substrate. The layer of poly 2 is labeled generally as 64. It includes an electrical interconnect 23 which connects the gate electrode of transistor 14 to the drain of transistor 12 and an electrical interconnect 25 that couples the gate electrode of transistor 12 to the drain of transistor 14 to form the cross-coupled connections 23 and 25 as shown in FIG. 2.

FIG. 5 shows two types of contact openings at which poly 2 connects to poly 1 and to the substrate, respectively. The contact opening 66 to poly 1 is called an FPCC contact and the contact opening to substrate is called an SC1 contact. At those locations where both the FPCC contact 66 and the SC1 contact 68 overlap then poly 1 is exposed for electrical contact to poly 2. However, in those areas where only SC1 provides an opening 68, the substrate itself is exposed for electrical contact to poly 2 but poly 1 is protected by an oxide layer, so there is no contact from poly 2 to poly 1 at those locations. This type of contact opening is conventional in the art as disclosed in U.S. Pat. No. 4,868,138 (the '138 patent) incorporated herein by reference. Of course, the contacts from poly 2 to poly 1 and to substrate can be obtained by any acceptable technique, one of which is disclosed in more detail in the '138 patent.

The SC1 contact 68 is also provided at the bitline contacts which electrically connects poly 2 to the substrate at the location shown as B1 and $\overline{B1}$. Poly 2 is then deposited into the opening 68 at the bitlines to provide a first level electrical interconnection to the substrate. The use of polysilicon to contact the bitlines is particularly advantageous because better step coverage can be obtained with the combination of layers polysilicon and aluminum than is usually possible with aluminum by itself. Accordingly, the bitline contact openings can be made smaller and still retain the assurance of solid electrical contact without shorts by using poly 2 than would be possible if a bit line contact opening were required from metal 1 to the substrate. This permits the wordlines to be placed closer together from adjacent rows, thus further increasing the packing density of memory cells on the chip.

Figure 6:
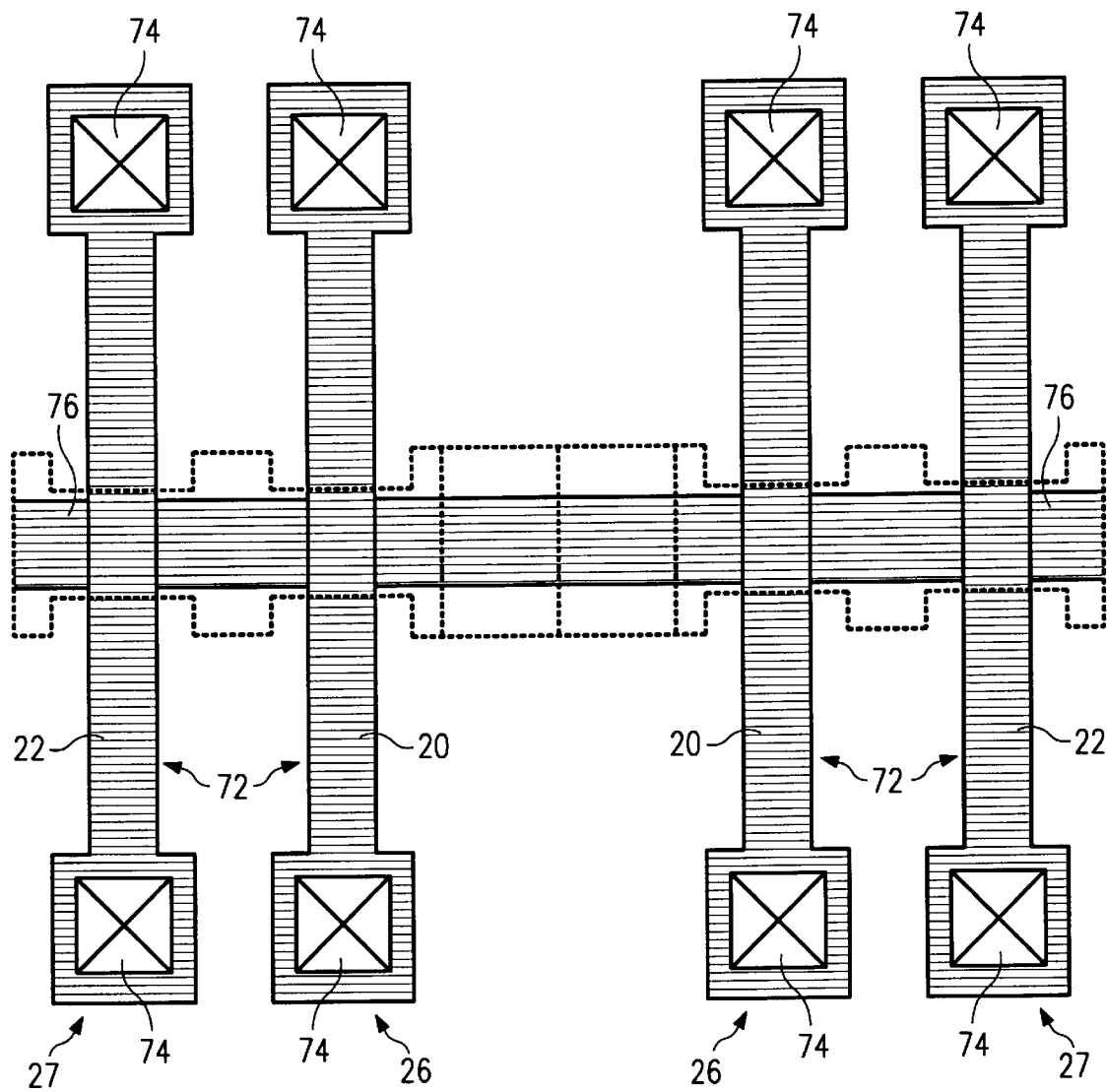
FIG. 6 is a plan view of the layout according to the invention for four memory cells showing poly 3, contact openings from poly 3 to poly 2 and the doping mask for $V_{CC}$ connection.

FIG. 6 shows poly 3 layer 72 and contact openings 74 which will overlay on top of the structure of FIG. 5. Poly 3 contacts poly 2 at the openings 74. Poly 3 contains the load elements 20 and 22. The central region 76 of poly 3 is heavily doped N type to be highly conductive for connection to VCC. VCC is thus connected through the respective load elements 20 and 22 to the data storage nodes 26 and 27 corresponding to those locations shown in FIG. 3.

Figure 7:
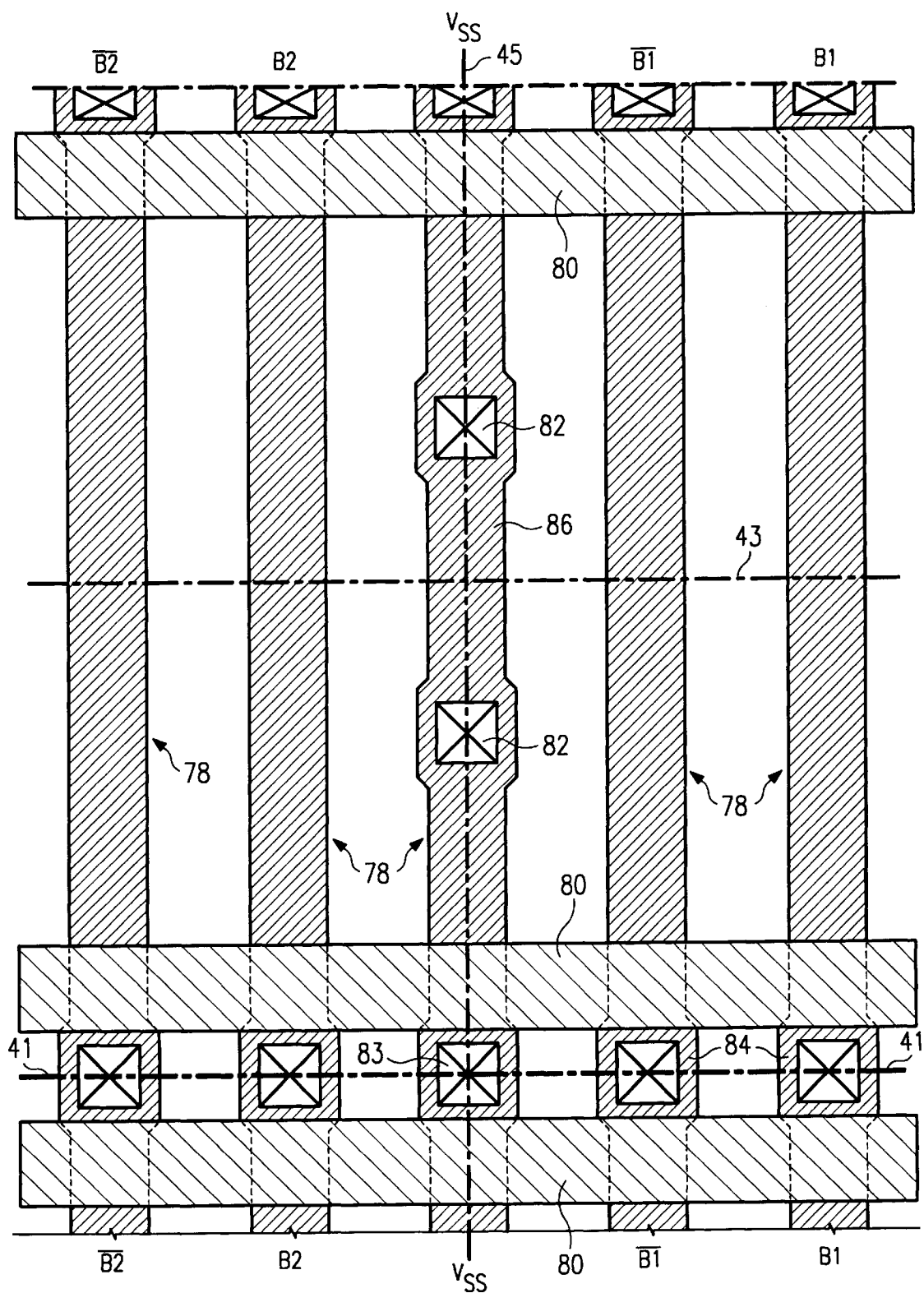
FIG. 7 is a plan view of the layout according to the invention for four memory cells showing metal 1, metal 2, the contact openings from metal 1 to poly 2 and from metal 1 to substrate.

FIG. 7 shows metal 1 78, metal 2 80, and electrical contacts 82 from metal 1 to substrate and contacts 84 from metal 1 to poly 2. The structure of FIG. 7 overlays on the combined structure formed from FIGS. 4–6. The second metal level 80 is electrically connected to the wordline 32 every 16 memory cells via the appropriate interconnection. This interconnection can be in the form of a switching transistor or direct electrical contact not shown since both techniques are well known and conventional in the art. The use of the second metal 80 running directly above the wordline and parallel thereto provides the advantage of significant speed in accessing the transistors. The metal line 80 is a straight line across the entire row and thus tracks, and is exactly parallel to the wordline 32 directly below it which it controls.

The first metal level 78 forms the bitlines which carry the data to and from the memory cells at bitline contacts 84. The bitline contacts 84 are connected to poly 2 which in turn is connected to the substrate. Therefore, rather than have the metal bitline directly connected to the substrate, it is connected to poly 2, which connects to substrate and the spacing between adjacent wordlines can be made smaller than would otherwise be possible if the first metal level 78 were required to contact the substrate itself.

First metal 78 contacts the substrate at ground contacts 82 and 83. The center metal line 86 is directly connected to VSS to provide ground to the memory cell and to the substrate itself. Contacts 82 provide two contacts from metal to the source region 46 to each of the central source region 38 to provide ground closely adjacent the two memory cells of each respective row.

The use of two contacts to the same source region provides significant advantages in the assurance of cell stability and the dissipation of stray charge and currents. The substrate to metal contacts 82 are closely positioned to the respective shared source regions of two memory cells so that the total path to travel is very short and thus the total resistance is very low. This reduces the likelihood that any discontinuities or defects in the crystalline structure will interfere with the source of the storage transistors being directly connected to a metal ground line. All current may be quickly and easily shorted to ground from the memory cell. By overlaying the structure of FIG. 7 on the structure of FIG. 4, the contacts 82 are positioned at each end of the source region 38, very close to the respective rows of the memory cells. A second source contact 82 is provided for the two memory cells in the second row even though they share a common source region. This second contact provides the same beneficial effect for the transistors in the second rows as provided by the contact 82 to the first rows. The use of two metal to source contacts within the same source region provides an additional beneficial effect to ensure adequate contact. In the event of some slight defect or discontinuities in the crystalline structure or the contact itself about one of the contacts 82, the other contact 82 to the same source region will be able to provide the full current requirements from all four memory cells and still provide stable operation of all four memory cells. The two contacts act as a redundancy measure to increase reliability of fast memory cells. Having the two contacts thus permits one contact to act as a backup to the other contact to provide some form of redundancy wiring.

Contact 83 directly connects VSS from a metal line to the p-well of the substrate. This p-well contact is made in between every pair of adjacent wordlines and thus is positioned between every set of four memory cells along the column line. This is in the same metal line to which the source contacts are made. This provides the distinct advantage that the p-well is always assured of being tied to the same voltage as the source itself. Any stray currents in either location are quickly grounded. Providing a cell with a local p-well tie-down acts to reduce well bounce and provide significant advantages of chip stability when very tight tolerances are used.

The cell according to the invention provides metal VSS to every memory cell and metal bit lines, yet has only 2.5 metal pitches per memory cell; 2 bit lines and half of a VSS line. It is thus smaller than many of the prior art designs that are of the type that provide metal lines directly to each portion of each memory cell. Such prior art designs often had 3 or 3.5 metal pitches per memory cell (see, for example, the '854 patent).

The metal lines, like all the other layers, are mirror image symmetrical for all major features about horizontal centerline 43 and vertical centerline 45.

Figure 8:
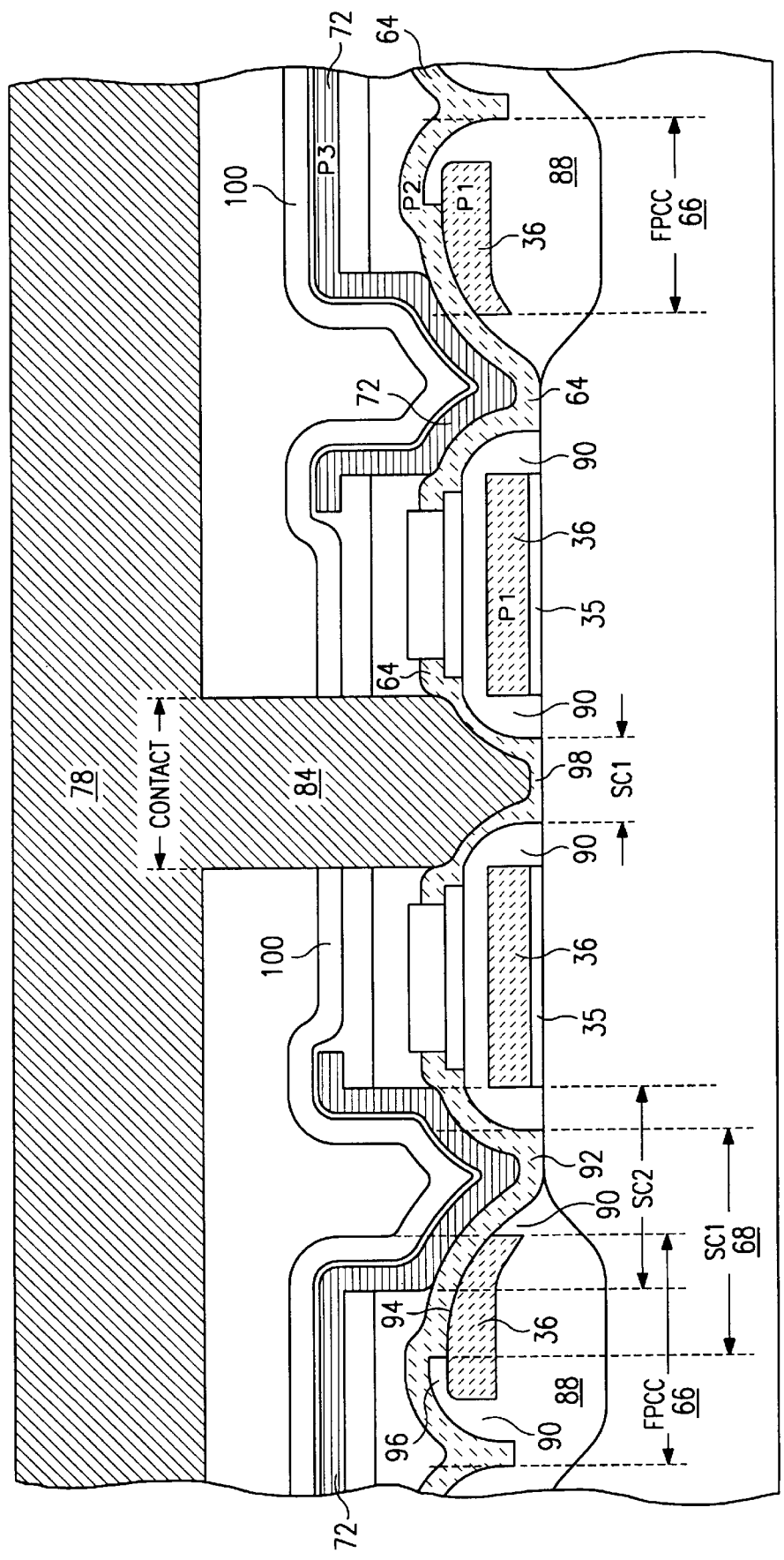
FIG. 8 is a cross-sectional view taken from the position shown by marks 8—8 in FIG. 5 including a combination of layers as shown in FIGS. 4, 5, and 6.

The process for manufacturing the memory cell will now be outlined and described with respect to FIG. 8 which is a cross-sectional view of a portion of two separate memory cells taken through the bitline. According to a preferred embodiment, the starting material is an N type wafer along crystalline structure 100. An N well mask is formed in an N well implant of phosphorous at a dose in the range of $6 \times 10^{12}$ ions/cm$^2$ is performed. Following this there is a well drive of 1150° C. for 90 minutes. The active area is then defined by the steps which include the formation of a thermal oxide having a thickness of approximately 130 angstroms on top of which a nitride layer is deposited having a thickness of approximately 1300 angstroms. Nitride is then etched to expose those areas which will become the active areas for the N channel transistors. An N channel field implant of BF2 at a dose in the range of $4 \times 10^{13}$ ions/cm$^2$ is then performed. On top of this is formed a 4000 angstrom field oxide 88 using conventional techniques known in the art for field oxide formation. The nitride layer is then removed and a blanket VT implant is made into the active areas of the transistors. In a first embodiment, the VT implant is boron having a dose in the range of $1.4 \times 10^{12}$ ions/cm$^2$ although it will be appreciated that different threshold implants doses and type can be used as desired. The p-well is then formed in two steps, boron having a dose in the range of $5.1 \times 10^{12}$ ions/cm$^2$ at 30 kEV followed by another boron implant having a dose in the range of $6 \times 10^{12}$ ions/cm$^2$ at 160 kEV. This provides the p-well into which the N channel transistors will be formed which make up the memory array. After the p-well is formed, the thermal gate oxide 35 is formed. in this embodiment having a thickness in the range of 50–120 angstroms, with about 70 angstroms being preferred. On top of the thermal gate oxide a poly is deposited to the appropriate thickness, usually in the range of 1500–2000 angstroms. On top of the blanket poly 1 layer is deposited an undoped oxide having a thickness in the range of 1700 angstroms. At this point in the process, the chip has been covered with a blanket layer of poly 1 on which is positioned a blanket layer of undoped oxide. The next mask is the FPCC mask which will be used to define the contacts to be made from poly 2 to poly 1. An etch is then performed in those contact openings to remove the oxide over poly 1 to expose poly 1 in those locations shown 66. As can be seen, this is a large rectangular area which exposes selected sections of poly 1. This process is further disclosed in the '138 patent.

Another mask is the used to define the gate electrodes which will be formed from poly 1. Once this mask is in place, the oxide is first etched from those locations defined by the mask after which the poly 1 is etched to form the layer 36 having the shape as shown in FIG. 4.

If desired, according to some embodiments, a metal silicide of appropriate composition will be deposited with poly 1 or formed after poly 1 so as to provide good conductivity of the gate electrodes. The formation of such metal suicides for a gate electrode is well known in the art and need not be described in detail herein.

After poly 1 has been patterned and formed an LDD implant followed by a sidewall deposition and etch and a heavy source drain implant are performed using techniques well known in the art. For example, in forming the LDD implant of the memory cell transistors, phosphorous at a dose in the range of $3.5 \times 10^{13}$ ions/cm$^2$ is implanted into the polysilicon and immediately adjacent the polysilicon gate.

An N channel halo implant of boron at a dose in the range of $1.0 \times 10^{13}$ ions/cm$^2$ is then performed. Undoped oxide is deposited to a thickness of 2000 angstroms. This undoped oxide is deposited over the entire surface and then etched to form the sidewall spacers 90 adjacent each layer of poly 1. After the spacer oxide is formed then the heavy source drain implant is performed, first arsenic at a dose in the range of $3 \times 10^{15}$ ions/cm$^2$ followed by phosphorous at a dose in the range of $3 \times 10^{14}$ ions/cm$^2$. The appropriate implants are also made for the P channel transistors in the peripheral circuitry. The source and drain regions in the substrate are not shown in this cross section for ease of reference since they are conventional in shape and size even though they are present at the locations shown in FIGS. 4 and 5.

After the source and drain regions have been completely formed, then an undoped oxide is deposited on all layers of poly 1 to a thickness of 1000 angstroms. Recalling that previously in the process some regions of poly 1 as defined by FPCC contact 66 have been exposed such layers will have on the top thereof a thinner layer of oxide. Other portions of poly 1 which did not correspond to the location of the FPCC contact 61 will have on the top thereof an additional oxide. At this time, the SC1 contact mask 68 is patterned and formed. The oxide is then etched so as to expose the silicon substrate. The same etch is sufficient to remove the silicon layer overlaying certain portions of poly 1 to expose poly 1 but is not sufficient to expose other locations of poly 1 which have not been subjected to the previous FPCC contact 66. The etching of the oxide is measured with sufficient precision to ensure clean and clear exposure of the substrate and certain regions of poly 1 while not overetching sufficient to expose poly 1 in those areas previously not opened by FPCC contact mask 66. Generally, an overetch of approximately 200 angstroms of oxide is sufficient to ensure complete etching of the desired areas without overetching. Poly 2 is then deposited to a thickness of approximately 800–1000 angstroms as shown in FIG. 8.

Poly 2 can be quite thin, 800 angstroms or less, if desired. In a preferred embodiment, poly 2 is not overlayed with a silicide but is doped during deposition to be of the N type. Poly 2 can be thin so as to reduce topography. A sheet resistance in the range of 800 ohm/sq. or even higher is acceptable for this design. Normally, poly 2 of the prior art designs is much thicker or has a silicide to achieve a low sheet resistance in the range of 10 ohm/sq. According to the invention, a low sheet resistance is acceptable and can be used, but the design is robust enough to permit good memory operation with a high sheet resistance and thus can take advantage of a thin poly 2 without a silicide on top thereof. A sheet resistance in the range of 500–1000 ohm/sq. is acceptable, with about 700–800 ohm/sq. being preferred. This thin poly 2 layer thus provides many advantages in the overall end structure.

FIG. 8 shows the advantageous deposition of poly 2 selectively on either poly 1 or into the substrate whose location is defined by a single contact mask SC1. As can be seen viewing SC1 contact mask opening in FIG. 8, where the opening is present, poly 2 is deposited on the exposed surfaces of the substrate at portion 92 as shown and also on top of poly 1 at location 94 as shown. At those positions where only SC1 itself is present, the substrate is exposed to permit contact of poly 2 at locations 92. On the other hand, where FPCC contact mask 66 overlaps SC1 contact mask 68 then poly 1 is exposed for contact by poly 2 layer 64. However, in those locations where only FPCC contact mask 66 is present poly 1 is not exposed and does not form an electrical contact with poly 2. This can be seen as region 96 in which an oxide layer separates poly 1 from poly 2 even though FPCC contact opening 66 is provided. Since the defining contact opening SC1 was not also present, no contact of poly 1 was provided. Similarly, in those locations 70 where SC1 contact mask 68 overlaps poly 1 it does not expose poly 1 because FPCC contact mask 66 is not also present. It will, however, expose substrate 68 immediately adjacent the poly silicon layer so as to be self-aligned to the gate electrode of poly silicon 1. Advantageously, only in those areas where both masks overlap on poly 1 will be exposed for contact of poly 2. This permits each mask to be sufficiently large to ensure good alignment within the tolerances available during the manufacturing process. The overlap portion 70 of SC1 contact mask 68 is made somewhat larger than the manufacturing tolerances so that even if the mask is out of alignment by its maximum permissible tolerance, there is still solid contact 2, the substrate itself, to form good electrical connection of a sufficiently large area with the very small dimensions available from the memory cell. This permits the memory cell to be made extremely small while ensuring that the electrical contacts within the memory cell are always sufficient to provide the desired electrical connections.

Bitline contact 98 of poly 2 layer 64 is positioned within the bitline for contact to the substrate at a tight tolerance, as explained herein.

After the formation and etching of poly 2, an undoped oxide deposition of approximately 500 angstroms thickness is provided. On top of this is provided a doped spin on glass followed by subsequent interpoly dielectric layers as is well known in the art. On top of these layers is deposited a third polysilicon layer 72 having a thickness of approximately 500 angstroms. The third polysilicon layer 72 is relatively thin so as to have a very high impedance to act as a load device. A mask is then formed and etched to expose poly 3 in the pattern shown as 76 in FIG. 6 and an N+ implant at a dose in the range of approximately $2 \times 10^{15}$ ions/cm$^2$ ions for VCC connection. After the VCC implant into poly 3, a mask is formed to define poly 3 and a poly etch is carried out to form the poly strips as shown in FIG. 6.

According to a first embodiment, the formation of the chip is completed by the appropriate depositions of undoped oxide, nitride, BSPG, and metal 1 and metal 2 using techniques known in the art. The load devices 20 and 22 are composed of undoped polysilicon in this embodiment. According to a second embodiment, poly 3 is covered with a very thin oxide layer and then exposed boron dopant of a dose in the range of $1 \times 10^{12}$ ions/cm$^2$ that goes through the oxide to form the load devices. According to yet a third embodiment, a very light dose in the range of N type dopant, such as arsenic or phosphorous, is made into the load devices of the polysilicon layer 72. Various techniques for forming the load device are described in the '854 patent previously introduced as well as in U.S. Pat. No. 4,251,876 and U.S. Pat. No. 5,330,933, incorporated herein by reference.

Following the formation of the load devices in third polysilicon layer 72, a glass layer 100 is conformly deposited over the entire third layer 72 of polysilicon. The undoped glass layer 100 can be either the appropriate oxide, nitride, or sandwich combination layers thereof so as to provide stability for the load device. After the deposition of the undoped glass, BPSG oxide is deposited and then reflowed using techniques well known in the art. First metal contact openings 82–84 are then formed at the locations as shown in FIG. 7. Metal 1 is then deposited to electrically contact the bitline output terminal through poly 2 and the substrate at the locations as has previously been described. The appropriate interlayer dielectric is then formed and metal 2 deposited and connections made using techniques which are well known in the art.

Figure 9:
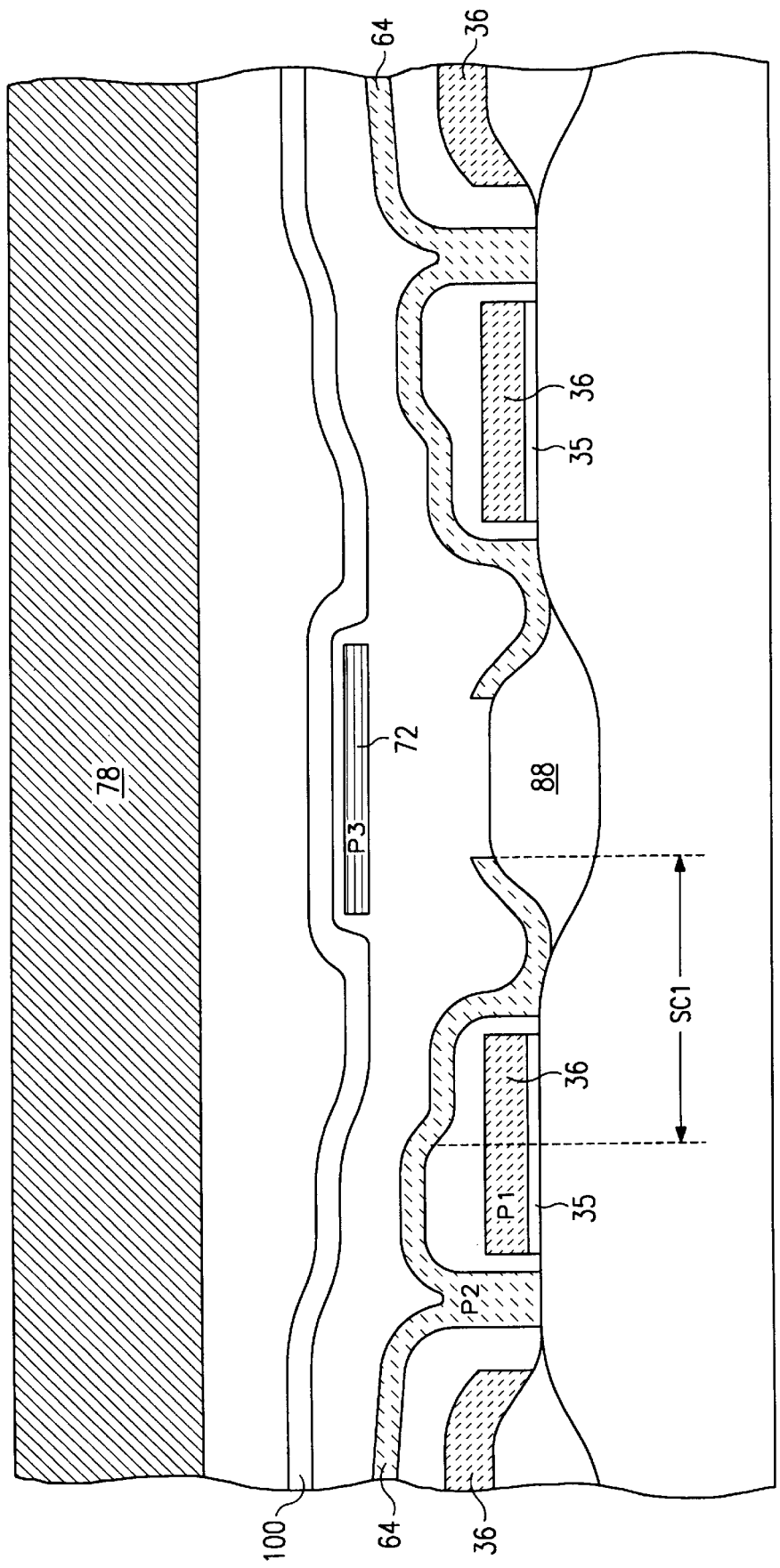
FIG. 9 is a cross-sectional view taken along lines 9—9 of FIG. 5 showing a combination of layers from FIGS. 4, 5 and 6.

FIG. 9 shows the final structure taken along cross-section lines 9—9 of FIG. 5. Self alignment of the poly 2 to substrate contact are shown as well as other features, such as field oxide 88, gate oxide 35, and other features as previously described. The source and drain regions in the substrate are not shown in FIG. 4 for simplicity and because they are conventional.

FIGS. 10 and 11 show an alternative embodiment of a single memory cell having a slightly different shape and aspect ratio than that of FIGS. 4–7. Similar structures are labeled with similar reference numbers for ease in understanding the layout. As with the layout of the memory cell of FIGS. 4–7, the main features of the single memory cell is replicated in mirror symmetry about horizontal axis 43 and vertical axis 45 so as to produce four memory cells having a common source region 30 in the substrate. Further, all gate electrode strips of poly 1, including the gate electrode 32 and the gate electrodes 44 and 54 for the storage transistors 44 and 54 are all parallel to each other so that the respective channel regions are also parallel to each other for all the transistors in the memory cell.

The memory cell layout as shown as FIGS. 10 and 11 has an aspect ratio of under 1.1. Again, the figures are drawn to relative scale with the layout as it will appear in masks. A simple measurement shows that the aspect ratio is in the range of 1.07, or nearly a square cell. It also has the advantageous features discussed with respect to the first embodiment, namely it has a plurality of contacts 82 from each source region 38 to a metal bitline. A heavily doped region 40 also has a contact 83 to the same ground line to prevent well bounce. The gate electrode 54 has a slightly enlarged end 55 to improve contact area from poly 1 to poly 2. It does, of course, remain straight across the gate electrode region and is substantially straight for its entire length so that a straight line can be drawn from one end of the gate electrode 54 to the other end of the gate electrode 54.

As is known, the enlarged square end of a terminating line becomes rounded and somewhat smaller when formed in silicon because of the optical characteristics of semiconductor processing. The head 55 will thus be smaller and rounded in the final product. Of course, the head 55 can be made somewhat smaller or larger as needed to ensure solid contact to poly 2 from the interconnection strip.

FIG. 11 shows the memory cell of FIG. 10 in a mirror image position. Further, the addition layers of poly 2 and poly 3 are shown with the appropriate contacts from poly 2 to substrate in poly 1 and from poly 3 to poly 2.

Figure 13:
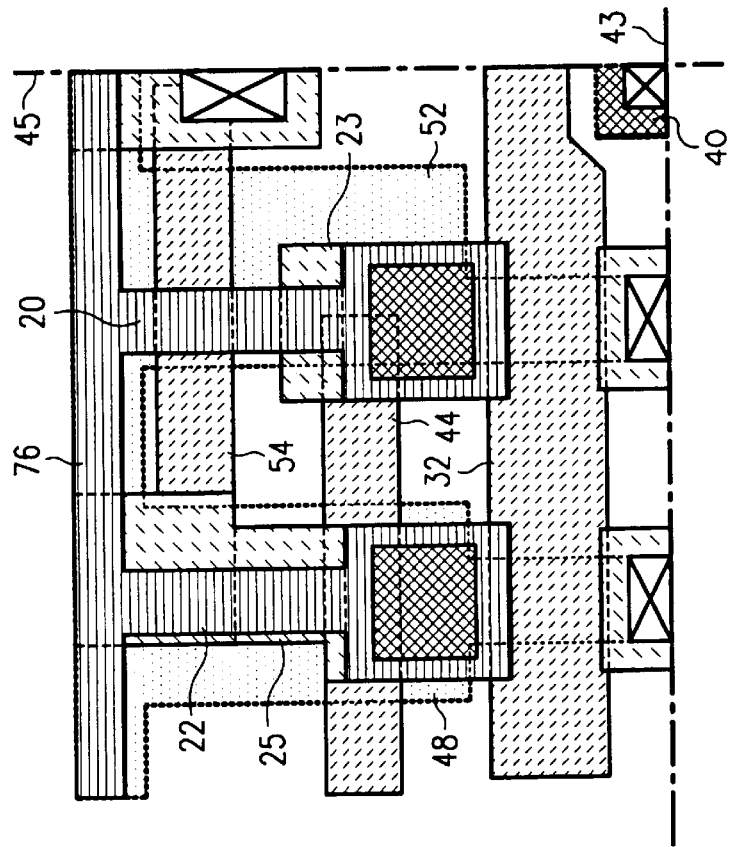
FIG. 13 is a plan view of the memory cell of FIG. 12 showing active area, poly 1, poly 2, poly 3, via openings from poly 3 to poly 2 and contact openings from metal 1 to poly 2 and substrate.
Figure 12:
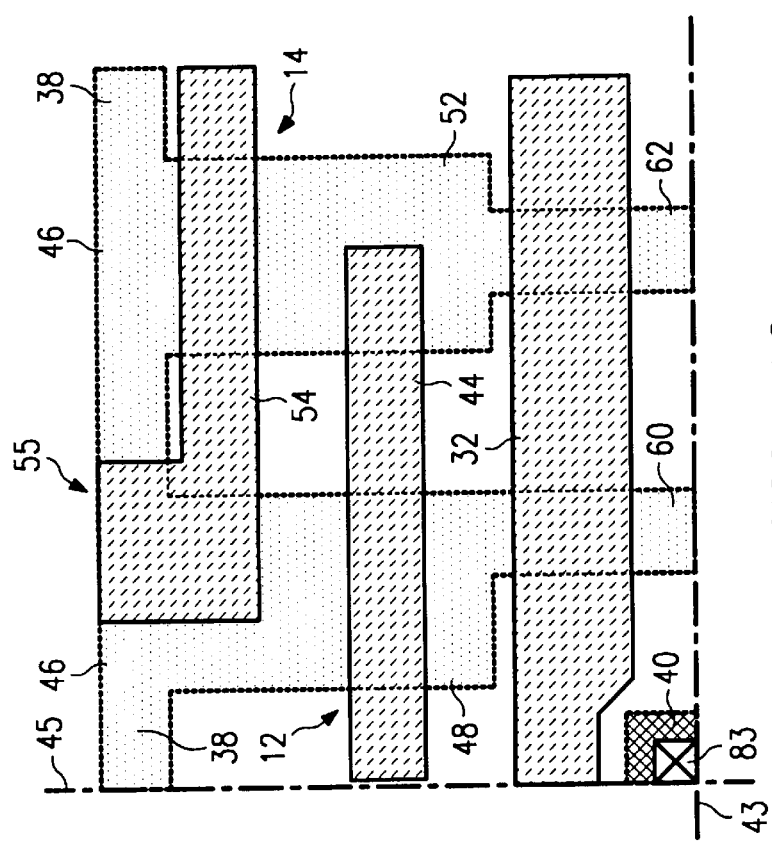
FIG. 12 is a plan view of an alternative embodiment of a memory cell showing poly 1 and active area.

FIGS. 12 and 13 illustrate a third embodiment of the layout of the memory cell according to the present invention. In this embodiment, as in the other embodiments, the gate electrodes 32, 44 and 54 are all parallel to each other. Further, the channel regions underneath these gate electrodes are straight, and parallel to each other. The gate electrodes continue straight to the entire portion of the transistor region over which they act as gate electrodes. Further, they are thus substantially straight for their entire gate electrode region. Further, they are generally straight for their entire length, having only minor deviations constant with a straight line. They are sufficiently straight that a straight line can be drawn through their entire lengths without leaving the polysilicon. As with the embodiment of FIGS. 10 and 11, the gate electrode 54 has a slightly enlarged head portion 55 to improve the contact from poly 2 to poly 1. This head portion 55 can be made somewhat smaller, larger, or of a slightly different shape so as to ensure a solid contact.

As can be seen, the large head portion 55 overlays the active region between two source regions 46. It does not electrically connect to the source regions 46 because it is separated therefrom by an oxide layer. In some embodiments, this oxide layer is the gate oxide, while in other embodiments it is a thicker oxide which will ensure that there is no electrical connection to ground the gate electrode 54 to the source 46. There is no concern about field effect problems or turning out of a transistor at the head portion of 55 because source regions 46 are always held at exactly the same electrical potential on both sides of the head region 55. Therefore, a transistor is not formed even with a very thin oxide used. For example, the oxide is the same as the gate oxide in one embodiment. This is acceptable to prevent formation of a transistor at this location because there is no potential difference possible between the two sides unless a transistor is not in fact formed. This design has the advantage that the gate electrode 44 is easily connected to the drain region 52 of the storage transistor 12. Namely, if desired, a contact can be easily made from the end of the electrode 44 which extends into the drain region 52 so as to provide the cross coupling electrical connection from the gate electrode 44 to the drain region 52 as shown. Alternatively, a contact to poly 2 can be performed as shown in FIG. 13.

The design of FIGS. 12 and 13 has the advantage of a particularly low aspect ratio, in this case lower than 1. Since the cell is wider than it is high, the aspect ratio is lower than 1, and in one embodiment has a value of approximately 0.95. A memory cell having an aspect ratio of below 1 is particularly advantageous for reducing the overall length to the bit lines. Since bit line length and bit line capacitance pose potential problems in large memory arrays, the use of a memory cell having an aspect ratio below 1 significantly shortens the bit lines through the array thus improving the speed characteristics and reducing the capacitance for the entire array. Further, the source region 46 is continuously connected to a common source region 38 of an adjacent memory cell. In some embodiments, the region 46 is slightly enlarged beyond that of the head 55 so that it is a single continuous source region without an interruption along the entire length of the array. Alternatively, it can be formed as a common region between two separate memory cells that are adjacent to each other, rather than between the storage transistors of a memory cell, according to that design which is shown in FIGS. 12 and 13.

FIG. 13 shows the same memory cells as FIG. 12, but is a mirror image replication about vertical axis 45 and horizontal 43 as explained with respect to the prior embodiments. It has the additional layers of poly 2, poly 1 and the context thereto similar to those which have been previously described.

The memory cell layouts which have been described herein permit particularly compact, and small layouts. For example, in a preferred embodiment, the individual gate electrodes are approximately 0.4 micros in total width for the storage transistors and in the range of 0.7–0.8 micros for the wordline gate electrodes. The entire memory cell is in the range of 3.5 by 3.85 microns in measurement forming a memory cell having an aspect ratio of approximately 1.1 and a total area of approximately 13.4 square microns. Of course, the scaling factors, design rules and minimum dimension geometries can be varied to obtain a smaller, or if desired, a larger memory cell, using techniques which are now known or which will be developed in the art which may be easily applied to the designs taught herein.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An SRAM structure formed in an integrated circuit comprising:

a substrate;

a first storage transistor having a drain region, a gate electrode, a channel region, and a source region;

a second storage transistor having a drain region, a gate electrode, a channel region, and a source region, the source regions of the first and second storage transistors being a contiguous common region in the substrate;

a first access transistor having a drain/source region, a gate electrode, a channel region, and a source/drain region; and a second access transistor having a drain/source region, a gate electrode, a channel region, and a source/drain region;

a first load element coupled between a voltage source and the drain region of the first storage transistor;

a second load element coupled between the voltage source and the drain region of the second storage transistor, said first and second storage transistors, said first and second access transistors and said first and second load elements forming a first SRAM cell in a first row and first column;

a second SRAM cell in an adjacent row and a third SRAM cell in an adjacent column to said first SRAM cell and a fourth SRAM cell in the same column as said third SRAM cell;

a metal line coupled to a ground supply voltage and a first electrical contact from said metal line to said contiguous common source region, the position of the electrical contact to the metal line being selected to ensure that the distance from any of the memory cells in the adjacent row or column to the electrical contact to said metal line is less than the width across the first SRAM cell in the direction of the first row; and a second electrical contact being positioned in the contiguous common source regions to provide one metal contact for every two SRAM cells in the SRAM structure. providing an effective one-half metal contact to ground for each of the four memory cells.

2. The structure according to claim 1, wherein said second SRAM cell has first and second storage transistors having a contiguous common source region that is a contiguous common source region in the substrate and that is also a contiguous common region with said contiguous common source region of the first and second storage transistors of the first SRAM cell.

3. The structure according to claim 2, further including a fourth SRAM cell in a second row adjacent to the first row, said fourth SRAM cell having first and second storage transistors having a contiguous common source region that is a contiguous common source region in the substrate that is also a contiguous common region with said contiguous common source region of the first and second storage transistors of the first and second SRAM cells.

4. The structure according to claim 1, further including an electrical contact from said metal line to the substrate, the metal contact to the substrate being spaced from the contact to the common source region.

5. The structure according to claim 1 wherein the gate electrodes of the first and second storage transistors and the gate electrodes of the first and second access transistors are all substantially parallel to each other for that portion of the length of each which functions as the gate electrode.

6. The structure according to claim 5 wherein the gate electrodes of the first and second storage transistors and the gate electrodes of the first and second access transistors are all generally parallel to each other for their entire respective lengths.

7. The structure according to claim 1 wherein the gate electrode for the first and second access transistors is a common gate electrode and that is substantially straight, between the first and second access transistors within a single memory cell.

8. The structure according to claim 7 wherein the gate electrode is sufficiently straight along the row that a perfectly straight line may be drawn which is within the gate electrode for its entire length along the entire first row of memory cells.

9. The structure according to claim 1 wherein the channel regions of the first and second storage transistors and the channel regions of the first and second access transistors are all substantially straight and are all parallel to each other.

10. The structure according to claim 1, further including a first strip of polysilicon electrically connecting the gate electrode of the first storage transistor to the drain region of the second storage transistor and a second strip of polysilicon electrically connecting the gate electrode of the second storage transistor to the drain region of the first storage transistor.

11. The structure according to claim 10 wherein said first and second strip of polysilicon are formed in a second layer of polysilicon.

12. The structure according to claim 11 wherein said load elements are formed in a third layer of polysilicon that is vertically above and overlays at least a portion of the second layer of polysilicon.

13. An SRAM structure formed in an integrated circuit comprising:

a substrate;

a first storage transistor having a drain region, a gate electrode, a channel region, and a source region;

a second storage transistor having a drain region, a gate electrode, a channel region, and a source region;

a first access transistor having a drain/source region, a gate electrode, a channel region, and a source/drain region; and a second access transistor having a drain/source region, a gate electrode, a channel region, and a source/drain region;

a connection from the source region of the second storage transistor to an overlying low impedance conductor;

a connection from the source region of the first storage transistor to a low impedance conductor in an overlying layer;

a first polysilicon high impedance load element coupled between a voltage source and the drain region of the first storage transistor;

a second polysilicon high impedance load element coupled between the first voltage source and the drain region of the second storage transistor, said first and second storage transistors, said first and second access transistors and said first and second load elements forming a first SRAM cell in a first row and first column, the SRAM cell being substantially square in that it has an aspect ratio of about 1.2 or less; and the gate electrodes of the first and second storage transistors and the gate electrodes of the first and second access transistors being substantially parallel to each other for that portion of the length along which each functions as a gate electrode.

14. The SRAM structure according to claim 13 wherein the SRAM cell has an aspect ratio of less than 1.1.

15. The SRAM structure according to claim 13 wherein the SRAM cell has an aspect ratio of less than 1.0.

16. The SRAM structure according to claim 13, further including second, third and fourth SRAM cells, said first and second SRAM cells being in the first row and in the first and a second column and the third and fourth SRAM cells being in a second row and in the first and second columns, said set of four SRAM cells being substantially square in that they have an aspect ratio of about 1.2 or less.

17. The SRAM structure according to claim 13 wherein the source regions of the first and second storage transistors are a common region in the substrate.

18. The structure according to claim 13, further including second, third and fourth SRAM cells each having first and second storage transistors that have a common source region in the substrate that is also a common source region with said common source region of the first storage transistor of the first SRAM cell.

19. An SRAM cell array formed in an integrated circuit comprising:

a group of four SRAM cells in two adjacent rows and two adjacent columns, said four SRAM cells having a central contiguous common source region that is spaced from a source region of other groups of SRAM cells in the array, said four cells being generally symmetrical about a first axis through said common source region;

each SRAM cell in the group of four cells having a first storage transistor having a drain region, a gate electrode, a channel region, and a source region;

a second storage transistor having a drain region, a gate electrode, a channel region, and a source region;

a first access transistor having a drain/source region, a gate electrode, a channel region, and a source/drain region; and a second access transistor having a drain/source region, a gate electrode, a channel region, and a source/drain region, the gate electrodes of the first and second storage transistors and the gate electrodes of the first and second access transistors all being substantially parallel to each other;

a first polysilicon high impedance load element coupled between a voltage source and the drain region of the first storage transistor; and a second polysilicon high impedance load element coupled between the first voltage source and the drain region of the second storage transistor, said first and second storage transistors, said first and second access transistors and said first and second load elements forming a first SRAM cell in a first row and first column.

20. The array according to claim 19, further including: a first contact from a metal line to the central contiguous source region of said group of four cells.

21. The array according to claim 20, further including a second contact from said metal line to the central contiguous source region, said second contact being spaced from said first contact.

22. The array according to claim 20, further including a third contact from said metal to a substrate that contains the contiguous source region, the third contact being adjacent the group of four memory cells, but spaced from the contiguous source region, the third contact ensuring that the contiguous source region and the substrate are at a common electrical potential with respect to the group of four memory cells.

23. The array according to claim 19 wherein the group of four memory cells is symmetrical about a second axis through the center contiguous source region.

* * * * *